(12) United States Patent
Lee

(10) Patent No.: US 12,119,211 B2
(45) Date of Patent: *Oct. 15, 2024

(54) SUBSTRATE PROCESSING APPARATUS

(71) Applicant: ASM IP Holding B.V., Almere (NL)

(72) Inventor: ChangMin Lee, Seoul (KR)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/367,200

(22) Filed: Sep. 12, 2023

(65) Prior Publication Data

US 2023/0420227 A1    Dec. 28, 2023

Related U.S. Application Data

(63) Continuation of application No. 17/307,663, filed on May 4, 2021, now Pat. No. 11,804,364.

(60) Provisional application No. 63/027,196, filed on May 19, 2020.

(51) Int. Cl.
*H01J 37/32*    (2006.01)

(52) U.S. Cl.
CPC .. *H01J 37/32541* (2013.01); *H01J 37/32082* (2013.01); *H01J 37/32577* (2013.01); *H01J 37/32724* (2013.01); *H01J 37/32935* (2013.01)

(58) Field of Classification Search
CPC .......... H01J 37/32541; H01J 37/32082; H01J 37/32577; H01J 37/32724; H01J 37/32935
See application file for complete search history.

(56) References Cited

U.S. PATENT DOCUMENTS

2014/0373782 A1 * 12/2014 Park .................. H01J 37/32174
                                                             118/500

FOREIGN PATENT DOCUMENTS

JP           5979182 B2 *  8/2016  ........ H01J 37/32091
KR     20190103795 A  *  9/2019

* cited by examiner

*Primary Examiner* — Henry Luong
(74) *Attorney, Agent, or Firm* — Snell & Wilmer L.L.P.

(57) ABSTRACT

A substrate processing apparatus capable of locally controlling a plasma intensity and improving thin film properties and thickness uniformity includes: a power supply unit, a processing unit electrically connected to the power supply unit, and a substrate support unit below the processing unit, wherein the substrate support unit includes a first ground electrode and a second ground electrode.

20 Claims, 14 Drawing Sheets

(a)  (b)

(a)  (b)

SUBSTRATE PROCESSING APPARATUS

CROSS-REFERENCE TO RELATED APPLICATIONS

This application is a continuation of, and claims priority to, U.S. patent application Ser. No. 17/307,663 filed May 4, 2021 titled SUBSTRATE PROCESSING APPARATUS; which claims the benefit of U.S. Provisional Patent Application Ser. No. 63/027,196 filed May 19, 2020, the disclosures of which are hereby incorporated by reference in their entirety.

BACKGROUND

1. Field

One or more embodiments relate to a substrate processing apparatus, and more particularly, to a substrate processing apparatus configured to process a substrate by supplying plasma power through a processing unit arranged on the substrate.

2. Description of the Related Art

A substrate processing apparatus includes a heating block for heating a substrate to perform a process on the substrate. A substrate support unit including the heating block may also function as an electrode during plasma processing. For example, in an in-situ plasma process, a heating block and a showerhead facing each other in a reaction space have functions of a lower electrode and an upper electrode, respectively.

As the size of a substrate to be processed increases, a localized variation phenomenon of plasma density occurs, and as a result, thin film properties and thickness uniformity at the center and edge portions of the substrate may deteriorate. A problem of deterioration of the uniformity of plasma is also mentioned in Japanese Patent Publication No. 2004-363552. In more detail, according to paragraph [0004] of this patent publication, non-uniformity of plasma density occurs at the center and edge portions of an electrode.

SUMMARY

One or more embodiments include a substrate processing apparatus capable of reducing plasma non-uniformity on a substrate.

Additional aspects will be set forth in part in the description which follows and, in part, will be apparent from the description, or may be learned by practice of the presented embodiments of the disclosure.

According to one or more embodiments, a substrate processing apparatus includes a power supply unit, a processing unit electrically connected to the power supply unit, and a substrate support unit below the processing unit, wherein the substrate support unit includes a first ground electrode and a second ground electrode.

According to an example of the substrate processing apparatus, the processing unit may be configured to function as an electrode that supplies power to a reaction space.

According to another example of the substrate processing apparatus, the second ground electrode may be apart from the first ground electrode and arranged to surround the first ground electrode.

According to another example of the substrate processing apparatus, the first ground electrode and the second ground electrode may be electrically connected to ground, and the substrate processing apparatus may include at least one of a first plasma intensity controller connected between the first ground electrode and the ground and a second plasma intensity controller connected between the second ground electrode and the ground.

According to another example of the substrate processing apparatus, at least one of the first plasma intensity controller and the second plasma intensity controller may include an L-C circuit including an inductor, a capacitor, and a variable capacitor.

According to another example of the substrate processing apparatus, at least one of the first ground electrode and the second ground electrode may include a plate ground electrode.

According to another example of the substrate processing apparatus, at least one of the first ground electrode and the second ground electrode may include a mesh ground electrode.

According to another example of the substrate processing apparatus, the mesh ground electrode includes a first ground line extending in a first direction, and a second ground line extending in a second direction different from the first direction, wherein the first ground line and the second ground line may be electrically connected to each other.

According to another example of the substrate processing apparatus, the first ground line and the second ground line contact each other at a portion where the first ground line and the second ground line intersect each other, and the first ground line and the second ground line may be electrically connected to each other at contact therebetween.

According to another example of the substrate processing apparatus, the first ground line and the second ground line are apart from each other at a portion where the first ground line and the second ground line intersect, and the first ground line and the second ground line may be electrically connected to each other by a conductive member that connects between an end of the first ground line and an end of the second ground line.

According to another example of the substrate processing apparatus, in a plurality of first portions where the first ground line and the second ground line intersect each other, a distance between an upper surface of the substrate support unit and the first ground line is greater than a distance between the upper surface of the substrate support unit and the second ground line, and in a second portion other than the first portion, a distance between the upper surface of the substrate support unit and the first ground line may be equal to a distance between the upper surface of the substrate support unit and the second ground line.

According to another example of the substrate processing apparatus, the first ground electrode may include a first mesh ground electrode, the second ground electrode may include a second mesh ground electrode, wherein the first mesh ground electrode and the second mesh ground electrode may have different mesh densities.

According to another example of the substrate processing apparatus, the first ground electrode may be arranged at a different level from that of the second ground electrode.

According to another example of the substrate processing apparatus, the first ground electrode and the second ground electrode may partially overlap.

According to another example of the substrate processing apparatus, the substrate processing apparatus may further include a first electrode rod contacted to the first ground electrode, and a first connection rod electrically connecting the first electrode rod to the ground.

According to another example of the substrate processing apparatus, the substrate processing apparatus may further include a first buffer rod between the first electrode rod and the first connection rod.

According to another example of the substrate processing apparatus, the first electrode rod may include a first metal component, and the first connection rod may include a second metal component different from the first metal component, wherein the first buffer rod may include an alloy component of the first metal component and the second metal component.

According to another example of the substrate processing apparatus, the substrate support unit may include a first heating unit below the first ground electrode, and a second heating unit below the second ground electrode, wherein the first heating unit and the second heating unit may be independently controlled.

According to one or more embodiments, a substrate processing apparatus includes a power supply unit, a showerhead electrode electrically connected to the power supply unit, and a heating block below the showerhead electrode, wherein the heating block includes a disk-shaped first ground electrode and a ring-shaped second ground electrode apart from the disk-shaped first ground electrode and surrounding the disk-shaped first ground electrode, at least one of the disk-shaped first ground electrode and the ring-shaped second ground electrode is connected to an L-C circuit including an inductor, a capacitor, and a variable capacitor, the L-C circuit is connected to ground, and at least one of density and intensity of plasma in a reaction space may be adjusted through parameter control of the L-C circuit.

According to one or more embodiments, a substrate processing apparatus includes a first ground electrode connected to ground, and a second ground electrode apart from the first ground electrode and connected to the ground.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
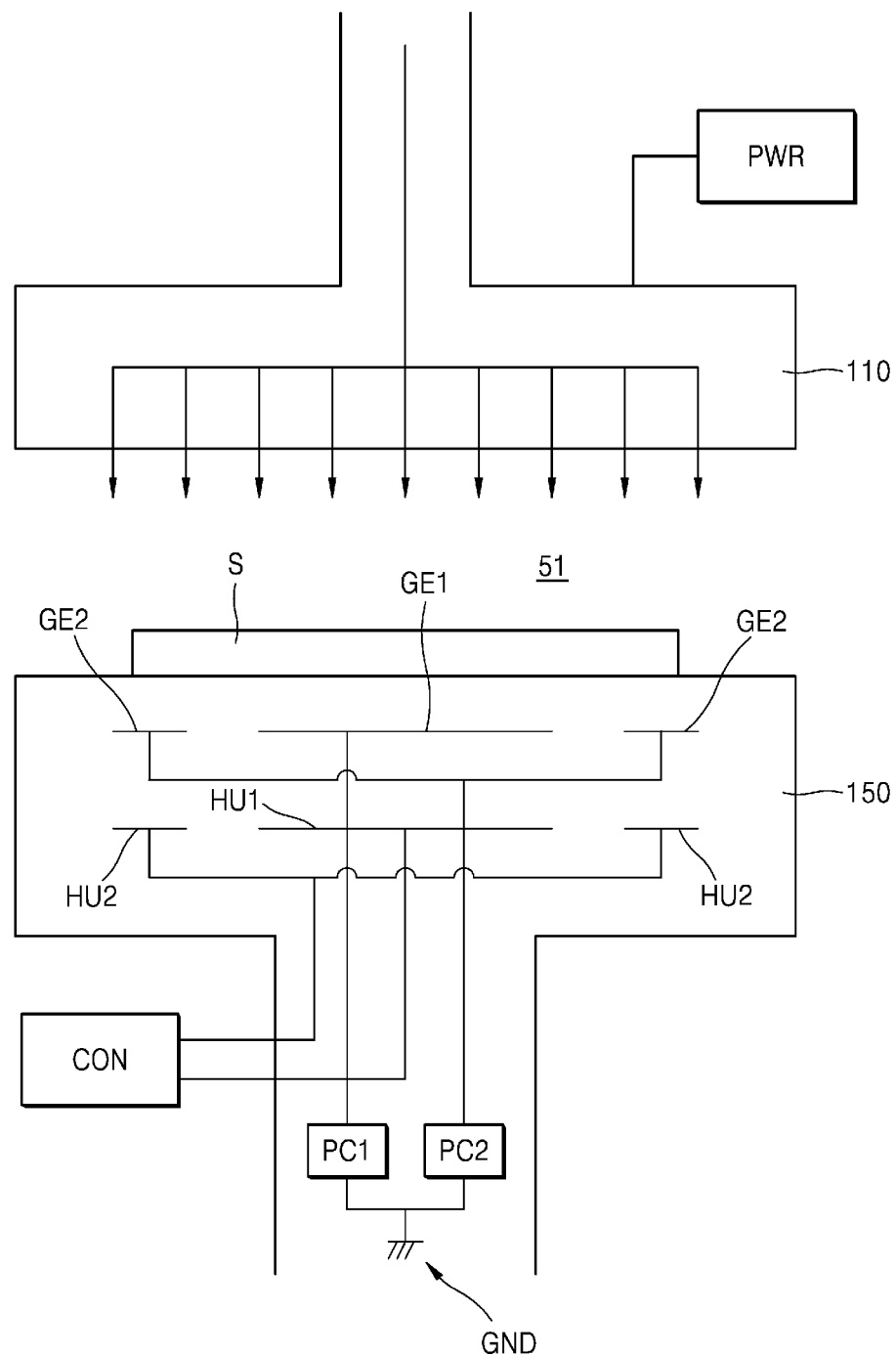
FIG. 1 is a view of a substrate processing apparatus according to embodiments of the inventive concept.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

In this regard, the present embodiments may have different forms and should not be construed as being limited to the descriptions set forth herein. Rather, these embodiments are provided so that the present disclosure will be thorough and complete, and will fully convey the scope of the present disclosure to one of ordinary skill in the art.

The terminology used herein is for the purpose of describing particular embodiments and is not intended to limit the disclosure. As used herein, the singular forms "a", "an", and "the" are intended to include the plural forms as well, unless the context clearly indicates otherwise. It will be further understood that the terms "includes", "comprises" and/or "including", "comprising" used herein specify the presence of stated features, integers, steps, operations, members, components, and/or groups thereof, but do not preclude the presence or addition of one or more other features, integers, steps, operations, members, components, and/or groups thereof. As used herein, the term "and/or" includes any and all combinations of one or more of the associated listed items.

It will be understood that, although the terms first, second, etc. may be used herein to describe various members, components, regions, layers, and/or sections, these members, components, regions, layers, and/or sections should not be limited by these terms. These terms do not denote any order, quantity, or importance, but rather are only used to distinguish one component, region, layer, and/or section from another component, region, layer, and/or section. Thus, a first member, component, region, layer, or section discussed below could be termed a second member, component, region, layer, or section without departing from the teachings of embodiments.

Embodiments of the disclosure will be described hereinafter with reference to the drawings in which embodiments of the disclosure are schematically illustrated. In the drawings, variations from the illustrated shapes may be expected as a result of, for example, manufacturing techniques and/or tolerances. Thus, the embodiments of the disclosure should not be construed as being limited to the particular shapes of regions illustrated herein but may include deviations in shapes that result, for example, from manufacturing processes.

FIG. 1 is a view of a substrate processing apparatus according to embodiments of the inventive concept.

Referring to FIG. 1, the substrate processing apparatus may include a power supply unit PWR, a processing unit 110, and a substrate support unit 150.

The power supply unit PWR may generate power. The power may be, for example, electrical energy for generating plasma. In another example, the power may be the plasma itself. The generated power may be transmitted to the processing unit 110. For example, the power supply unit PWR may be electrically connected to the processing unit 110 through an RF rod, and thus, power (e.g., RF power) generated by the power supply unit may be transmitted to the processing unit 110 by the RF rod.

The processing unit 110 may be located on the substrate support unit 150 configured to support a substrate. A reaction space 51 may be defined between the substrate support unit 150 and the processing unit 110. The processing unit 110 may be a conductor and may be used as an electrode for generating plasma. That is, the processing unit 110 may serve as one electrode for generating plasma. Plasma may be generated in a reaction space 51 by the processing unit 110 electrically connected to the power supply unit PWR. In other words, the processing unit 110 may function as a plasma electrode that supplies power to the reaction space 51.

The processing unit 110 may include members that perform appropriate functions depending on a function of the substrate processing apparatus. For example, when the substrate processing apparatus performs a deposition function, the processing unit 110 may include a reactant supplier (e.g., a showerhead assembly). In another embodiment, when a reactor performs a polishing function, the processing unit 110 may include a polishing pad. In some embodiments, when the processing unit 110 itself functions as a showerhead assembly while being used as an electrode, the processing unit 110 may be referred to as a showerhead electrode.

The substrate support unit 150 may be configured to provide an area on which a substrate S (e.g., a semiconductor substrate or a display substrate) to be processed is seated. The substrate support unit 150 may be below the processing unit 110. The substrate support unit 150 may be supported by a support (not shown) capable of up and down and rotational movement. Furthermore, the substrate support unit 150 may include a conductor, and the substrate support unit 150 may function as an electrode (i.e., an opposite electrode of a gas supply electrode) that generates plasma using the conductor.

The substrate support unit 150 may include a first ground electrode GE1, a second ground electrode GE2, a first heating unit HU1, a second heating unit HU2, a first plasma intensity controller PC1, and a second plasma intensity controller PC2. Such a structure including a ground electrode and a heating unit may be referred to herein as a heating block.

The first ground electrode GE1 and the second ground electrode GE2 may be apart from each other. For example, the first ground electrode GE1 may be at the center of the substrate support unit 150, and the second ground electrode GE2 may be arranged to surround the first ground electrode GE1. In an example, the first ground electrode GE1 may be in the form of a disk (e.g., a circular or square disk), and the second ground electrode GE2 may be in the form of a ring (e.g., a circular ring or a square ring) surrounding the first ground electrode GE1.

In some embodiments, the substrate support unit 150 may include three or more ground electrodes. In FIG. 4C, for example, the three or more ground electrodes may include a center electrode 100 arranged at the center, a first ring electrode 2 surrounding the center electrode 100, and a second ring electrode 3 surrounding the first ring electrode 2.

The first ground electrode GE1 and the second ground electrode GE2 may be electrically connected to ground GND, respectively. That is, the ground electrodes GE1 and GE2 in the substrate support unit 150 are not connected to the power supply unit PWR that supplies power, but are connected to the ground GND. Therefore, a path through which power (e.g., RF power) supplied through the processing unit 110 moves to the ground GND may include a first channel through the first ground electrode GE1 and a second channel through the second ground electrode GE2.

At least one of the first channel and the second channel may include a rod. For example, when the first channel includes a rod, the first channel may include a single rod. In some embodiments, the first channel may include multiple rods. The second channel may include a rod, and in some examples, the first channel and the second channel may include separate rods.

When the first channel includes a plurality of rods, the first channel may include a first electrode rod and a first connection rod. The first electrode rod may contact the first ground electrode GE1. The first connection rod may electrically connect the first electrode rod to the ground GND. In some embodiments, a first buffer rod may be arranged between the first electrode rod and the first connection rod.

In a further embodiment, the first buffer rod may include an alloy component of the first electrode rod and the first connection rod. For example, when the first electrode rod includes molybdenum (Mo) and the first connection rod includes nickel (Ni), the first buffer rod may include a Mo—Ni alloy.

The first plasma intensity controller PC1 may be connected between the first ground electrode GE1 and the ground GND. Accordingly, power moving to the ground GND through the first channel may be controlled by the first plasma intensity controller PC1. The second plasma intensity controller PC2 may be connected between the second ground electrode GE2 and the ground GND. Accordingly, power moving to the ground GND through the second channel may be controlled by the second plasma intensity controller PC2.

In some embodiments, the plasma intensity controller (e.g., the first and/or second plasma intensity controllers PC1 and PC2) may include an L-C circuit including an inductor, a capacitor, and a variable capacitor. In some embodiments, the L-C circuit may be included only in the first plasma intensity controller PC1, and in other embodiments, the L-C circuit may be included only in the second plasma intensity controller PC2. In another embodiment, the L-C circuit may be included in both the first plasma intensity controller PC1 and the second plasma intensity controller PC2.

The first plasma intensity controller PC1 and the second plasma intensity controller PC2 may have different parameters. Through control of these parameters, at least one of density and intensity of plasma in a reaction space may be adjusted. In a further example, the plasma intensity controller may include a circuit configuration (e.g., a band pass filter) other than the L-C circuit.

In some embodiments, the first ground electrode GE1 and the second ground electrode GE2 (or any one of them) may include a plate ground electrode. For example, the first ground electrode GE1 may be a circular plate or a square plate, and the second ground electrode GE2 may be an annular disk or a square plate surrounding the first ground electrode GE1.

In some other embodiments, the first ground electrode GE1 and the second ground electrode GE2 (or any one of them) may include a mesh ground electrode. For example, the first ground electrode GE1 may be a disk-shaped mesh ground electrode in which a plurality of conductor wires intersect, and the second ground electrode GE2 may be a ring-shaped mesh ground electrode in which a plurality of conductor wires intersect. In an example in which the first ground electrode GE1 includes a first mesh ground electrode and the second ground electrode GE2 includes a second mesh ground electrode, the first mesh ground electrode and the second mesh ground electrode may have different mesh densities. Due to this difference in mesh density, plasma density or intensity on a substrate may be adjusted.

Figure 2:
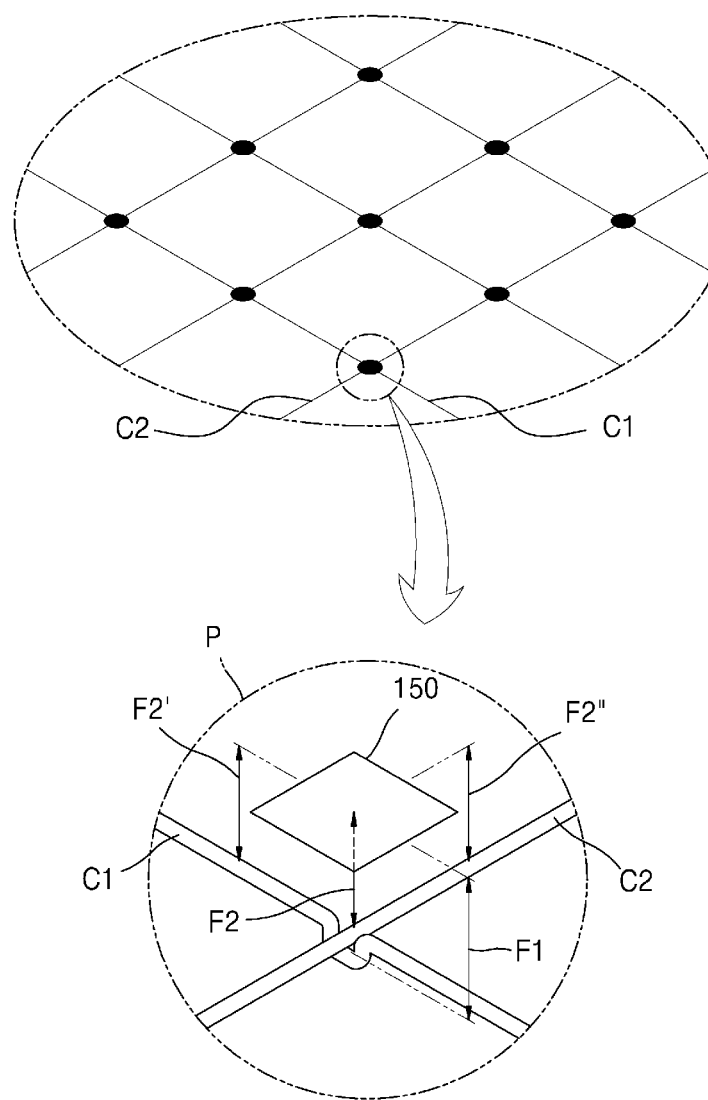
FIGS. 2 and 3 are views regarding a mesh ground electrode according to embodiments of the inventive concept.
Figure 3:
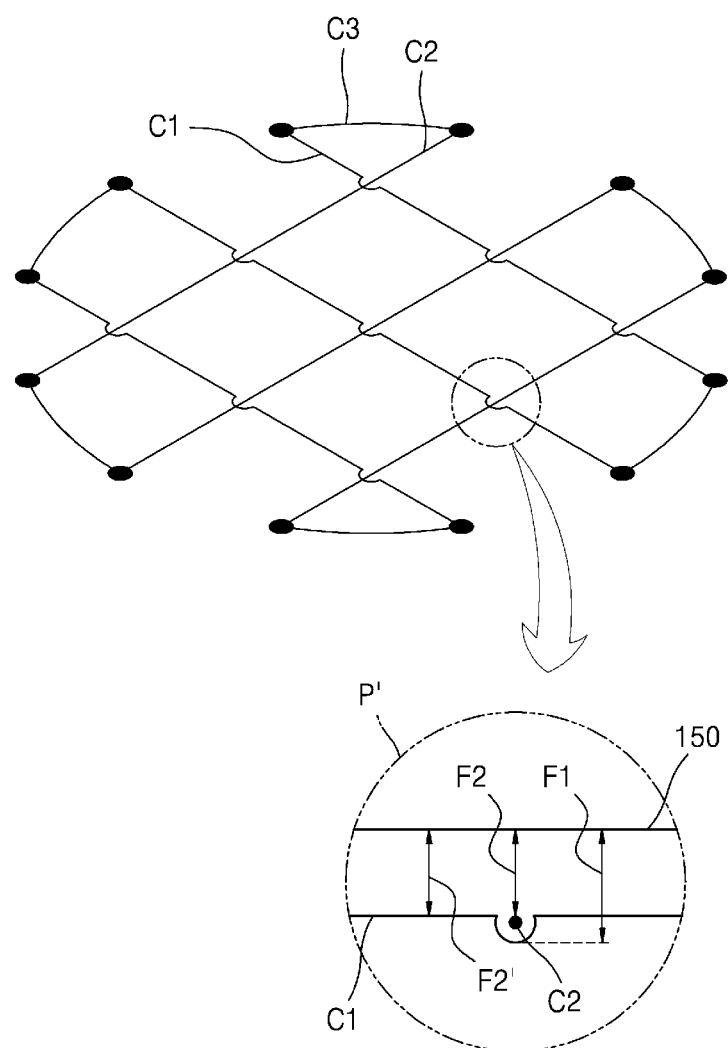

In some embodiments with respect to a mesh ground electrode, referring to FIGS. 2 and 3, the mesh ground electrode may include a first ground line C1 extending in a first direction and a second ground line C2 extending in a second direction different from the first direction. In addition, the first ground line C1 and the second ground line C2 may be electrically connected to each other. The first ground line C1 and the second ground line C2 may be arranged to be inserted into the substrate support unit 150.

In some examples, referring to FIG. 2, the first ground line C1 and the second ground line C2 may contact at a portion P where the first ground line C1 and the second ground line C2 intersect. A mesh ground electrode in which the first ground line C1 and the second ground line C2 are electrically connected may be implemented by a contact at the intersection.

In another example, referring to FIG. 3, the first ground line C1 and the second ground line C2 may be apart from each other at a portion P' where the first ground line C1 and the second ground line C2 intersect. In this case, the first ground line C1 and the second ground line C2 may contact at the edge. For example, a conductive member C3 may connect an end of the first ground line C1 to an end of the second ground line C2. A mesh ground electrode in which the first ground line C1 and the second ground line C2 are electrically connected may be implemented by a contact at the edge.

As illustrated in FIGS. 2 and 3, in a plurality of first portions where the first ground line C1 and the second ground line C2 intersect, a distance F1 between an upper surface of the substrate support unit 150 and the first ground line C1 may be greater than a distance F2 between the upper surface of the substrate support unit 150 and the second ground line C2. On the other hand, in a second portion other than the first portions, a distance F2' between the upper surface of the substrate support unit 150 and the first ground line C1 may be the same as a distance F2" (of FIG. 2) between the upper surface of the substrate support unit 150 and the second ground line C2 in which the first ground line C1 and the second ground line C2 do not intersect. Therefore, in the entire area of the mesh ground electrode, a distance between the upper surface of the substrate support unit 150 and a ground wire (i.e., the first grounding line C1 and the second grounding line C2) may be kept constant.

Although FIG. 1 shows that the first ground electrode GE1 and the second ground electrode GE2 are arranged at the same height, the first ground electrode GE1 may be arranged at a level different from that of the second ground electrode GE2. In other words, a distance between the upper surface of the substrate support unit 150 and the first ground electrode GE1 may be different from a distance between the upper surface of the substrate support unit 150 and the second ground electrode GE2.

Due to the level difference between the first ground electrode GE1 and the second ground electrode GE2, the density or intensity of plasma may be adjusted for each location of a reaction space. For example, when the first ground electrode GE1 at the center of the reaction space is arranged at a higher level than that of the second ground electrode GE2 at the edge of the reaction space, plasma having a greater intensity may be applied to the center or the edge of the reaction space.

When the first ground electrode GE1 is arranged at a different height from the second ground electrode GE2, a distance between the first ground electrode GE1 and the second ground electrode GE2 in a horizontal direction (i.e., an extension direction of the first ground electrode GE1 and the second ground electrode GE2) may be zero. Furthermore, in some other embodiments, the first ground electrode GE1 and the second ground electrode GE2 may partially overlap in a horizontal direction.

Referring again to FIG. 1, the first heating unit HU1 may be below the first ground electrode GE1, and the second heating unit HU2 may be below the second ground electrode GE2. The first heating unit HU1 may have a shape corresponding to the first ground electrode GE1, and the second heating unit HU2 may have a shape corresponding to the second ground electrode GE2. For example, when the first ground electrode GE1 is a disk-shaped electrode, the first heating unit HU1 may have a disk shape. In addition, when the second ground electrode GE2 is a ring-shaped electrode, the second heating unit HU2 may also have a ring shape.

The first heating unit HU1 and the second heating unit HU2 may be controlled independently. For example, a controller CON may be electrically connected to the first heating unit HU1 and the second heating unit HU2, and a first signal for controlling the first heating unit HU1 and a second signal for controlling the second heating unit HU2 may be generated from the controller CON. The first signal and the second signal may be transmitted to the first heating unit HU1 and the second heating unit HU2, respectively, through different channels. In the above embodiment, a plurality of heating units are disclosed, but the disclosure is not limited thereto, and may be configured as a single unit. In this case, the controller CON may generate a single signal and transmit the single signal to a heating unit.

FIG. 4 is a substrate processing apparatus according to embodiments of the inventive concept, and shows a state in which a heating element such as a heating wire is omitted for easier understanding. The substrate processing apparatus according to these embodiments may be a modification of the substrate processing apparatus according to the above-described embodiments. Hereinafter, repeated descriptions of the embodiments will not be given herein.

Figure 4A:
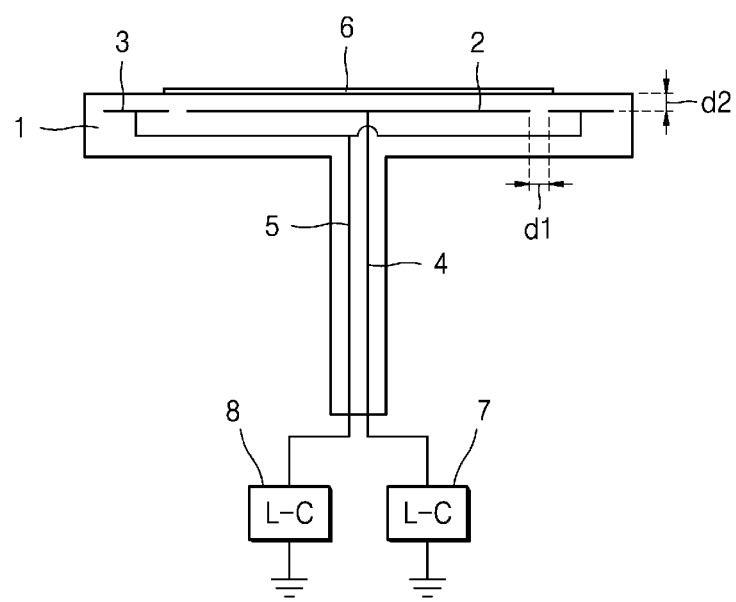
FIGS. 4A, 4B, and 4C are views of a substrate processing apparatus according to embodiments of the inventive concept.
Figure 4B:
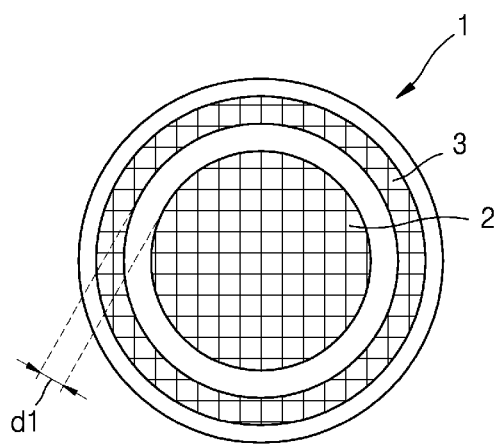
Figure 4C:
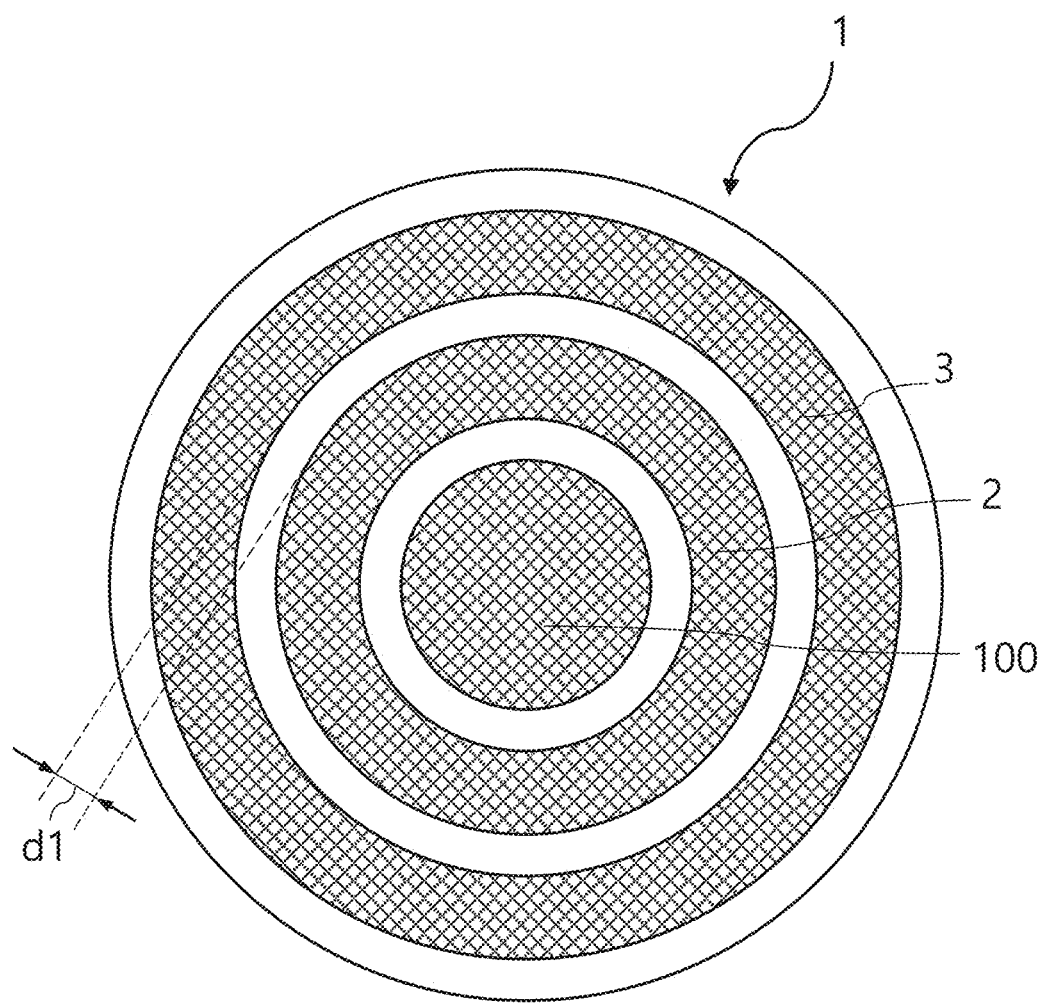

Referring to FIGS. 4A and 4B, a heating block 1 includes an RF ground electrode therein, wherein a plurality of RF ground electrodes are arranged independently of each other. The RF ground electrode includes a first RF ground electrode 2 and a second RF ground electrode 3, and the second RF ground electrode 3 is configured to surround the first RF ground electrode 2. In FIG. 4A, a first RF ground rod 4 is connected to the first RF ground electrode 2, a second RF ground rod 5 is connected to the second RF ground electrode 3, and the first RF ground electrode 2 and the second RF ground electrode 3 are connected to ground through the first RF ground rod 4 and the second RF ground rod 5, respectively.

In the case of a heating block including a plate electrode therein, properties of the electrode are process variables that affect the process on a substrate. For example, the difference in the thermal expansion coefficients between an electrode and a heating block during a high temperature process, a specific shape of a plate electrode, or the like affect process reproducibility and uniformity of a process performed on a substrate, such as the uniformity of a thin film deposited during a thin film process, plasma uniformity on the heating block, and the like. In general, a plate electrode in a heating block includes a single layer plate electrode to realize plasma uniformity on a substrate. However, in practice, there is a problem in that uniformity of a substrate process is deteriorated due to heat loss, non-uniformity of gas flow supplied on the substrate, and the like. For example, due to non-uniform distribution of gas on a substrate, localized bias of plasma density may occur, and uniformity of thin film properties and thickness at the center and edge of the substrate may be deteriorated. However, in a substrate processing apparatus according to embodiments of the inventive concept, the first RF ground electrode 2 and the second RF ground electrode 3 are arranged to be apart from each other, so that non-uniformity of plasma at the center and edge of a substrate may be individually controlled, and thus uniformity of thin film properties and thickness of the film on the substrate may be improved.

The first RF ground electrode 2 and the second RF ground electrode 3 may be formed in a mesh shape and are apart from each other by a distance d1. Typically, an RF ground electrode embedded in a heating block is made by printing to have an integral plate shape. However, in a high temperature process, a stress difference may occur due to a difference in thermal expansion coefficient between the heating block and the embedded RF ground electrode, which may cause the heating block to be destroyed. For example, since the thermal expansion coefficient of a heating block including AlN materials is $4.5 \times 10^{-6}/°$ C., and the thermal expansion coefficient of an RF ground electrode including Mo materials is $4.8 \times 10^{-6}/°$ C., the heating block may be separated or damaged due to a stress difference at high temperature.

Figure 5:
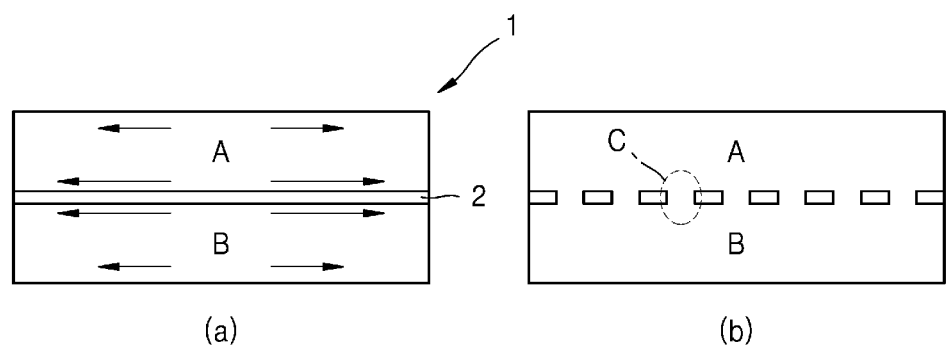
FIG. 5 is a view of an RF ground electrode in a heating block according to embodiments of the inventive concept.

On the other hand, in the disclosure, since the RF ground electrode is in the form of a mesh, a constituent material of a heating block, for example, AlN, is filled between electrode wires to minimize destruction of the heating block due to the difference in stress. In more detail, as shown in FIG. 5A showing the integrated RF ground electrode 2 in the existing heating block, the heating block 1 is separated into an upper portion A and a lower portion B by the RF ground electrode 2. In a high temperature process, the upper and lower portions of the heating block may be separated or may crack due to a stress difference (see arrows) between the heating block 1 and the RF ground electrode 2. However, in the structure of FIG. 5B according to the disclosure, the upper portion A and the lower portion B of the heating block are connected to each other through an area C between parts of a mesh of the RF ground electrode, and thus the structure has a technical feature capable of suppressing separation or cracking of the heating block 1 in a high-temperature process.

Referring again to FIG. 4, the first RF ground rod 4 is connected to a first L-C resonance circuit 7 and the second RF ground rod 5 is connected to a second L-C resonance circuit 8. The L-C circuit includes an inductor L, a capacitor C, and a variable capacitor $C_{var}$, and controls a plasma intensity on the RF ground electrode. In addition to the LC circuit, a circuit for controlling the plasma intensity on the RF ground electrode is applicable. As an example of technical features of this configuration, thickness and properties of a thin film on a substrate may be locally controlled. In the case of a heating block, the temperature of a peripheral portion is lower than that of a central portion, and properties or thickness of the thin film of the peripheral portion may not be the same as those of the central portion. Alternatively, when exhaust ports of a substrate processing apparatus equipped with a plurality of reactors are arranged asymmetrically, the properties or thickness of a thin film at a specific location on a substrate may not be the same as those at the central portion. Therefore, through a configuration of a heating block according to the disclosure, thin film properties and thickness uniformity may be controlled and improved.

Although FIG. 4A shows that the first L-C resonance circuit 7 and the second L-C resonance circuit 8 are grounded (i.e., connected to ground), in other embodiments, the first L-C resonance circuit 7 and the second L-C resonance circuit 8 may be connected to a controller (not shown). The controller may receive plasma intensity information measured through a plasma probe capable of monitoring plasma in a reactor in real time, and may control the plasma intensity on a substrate in real time by controlling the first L-C resonance circuit 7 or the second L-C resonance circuit 8 based on the plasma intensity information.

As shown in FIG. 4B, the first RF ground electrode 2 and the second RF ground electrode 3 are apart from each other by the distance d1, thereby making it easier to individually control plasmas at the center and edge of the substrate. The distance d1 has a technical feature to prevent the first RF ground electrode 2 and the second RF ground electrode 3 from contacting each other due to thermal expansion. Preferably, the distance d1 is configured to be at least 5 mm or more.

Also in FIG. 4A, the diameter of the first RF ground electrode 2 is smaller than the diameter of a substrate 6. Therefore, plasma control of an inner surface portion excluding an edge portion of the substrate 6 is facilitated. The second RF ground electrode 3 has an inner diameter greater than at least the diameter of the substrate 6. Therefore, plasma control of the edge portion of the substrate 6 is facilitated.

In FIG. 4A, a distance d2 between the RF ground electrodes 2 and 3 and an upper surface of the heating block 1 is preferably maintained at 1 mm. When the distance d2 is 1 mm or less, the heating block 1 may be damaged because of deformation due to thermal expansion of an RF ground electrode at high temperature, and when the distance d2 is 1 mm or more, plasma intensity on the substrate may be lowered, and more RF power needs to be supplied to maintain process uniformity.

The distance d2 between the RF ground electrodes 2 and 3 and the upper surface of the heating block 1 affects the plasma distribution and plasma intensity on the substrate. An RF ground electrode according to the disclosure is configured in a mesh form, and since a portion where electrode wires in horizontal and vertical directions (X-Y axis) intersect is protruded, the distance d2 between the intersecting portion and a surface of the heating block 1 may be different from the distance d2 between the non-intersecting portion and the surface of the heating block 1.

Figure 6:
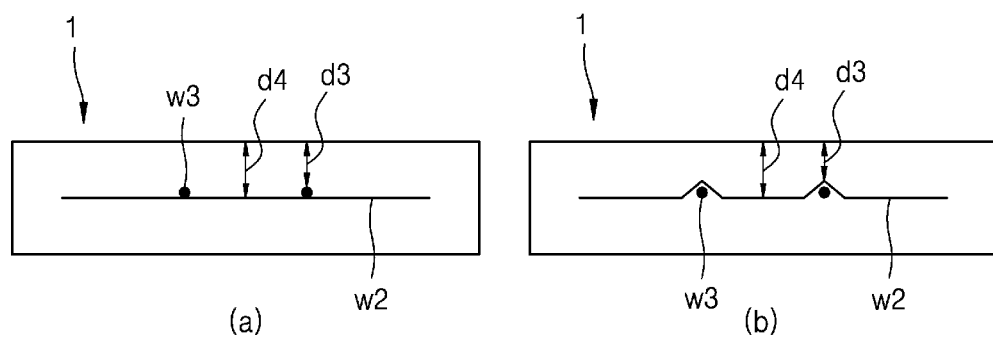
FIG. 6 is a view showing a case in which a distance between an RF ground electrode and a heating block surface is different for each location according to embodiments of the inventive concept.

FIG. 6 is a view of a case in which a distance between an RF ground electrode and a heating block surface is different for each location. In FIG. 6 (a) and FIG. 6 (b), a distance from a position where an RF ground electrode wire W2 arranged in an X-axis direction and an RF ground electrode wire W3 arranged in a Y-axis direction intersect to the upper surface of the heating block 1 is different from a distance from a position where the RF ground electrode wire W2 and the RF ground electrode wire W3 do not intersect to the upper surface of the heating block 1 (d3≠d4). Therefore, it is necessary to arrange RF ground wires such that a distance to an upper surface of a heating block is constant regardless of whether the RF ground wires intersect.

Figure 7:
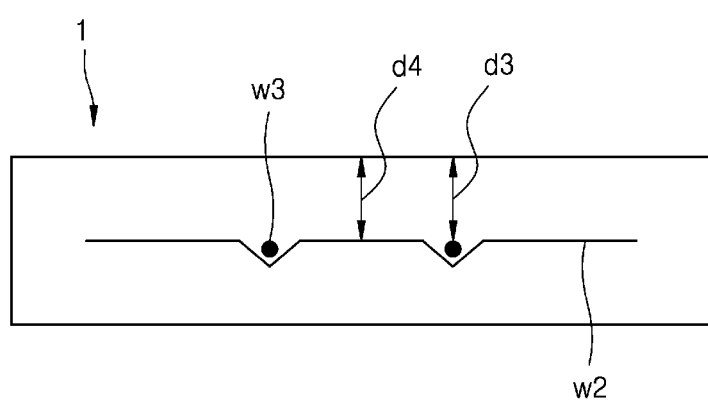
FIG. 7 is a view of showing an arrangement of RF ground wires according to embodiments of the inventive concept.

FIG. 7 is a view of an embodiment of an arrangement of RF ground wires according to the disclosure. In FIG. 7, a distance from a portion where the RF ground electrode wires W2 and W3 arranged in the X and Y axis directions intersect to the upper surface of the heating block 1 is the same as a distance from a portion where the RF ground electrode wires W2 and W3 do not intersect to the upper surface of the heating block 1 (d3=d4). Therefore, the embodiment of FIG. 7 has a technical feature that precise control of plasma on a substrate is easier.

Figure 8:
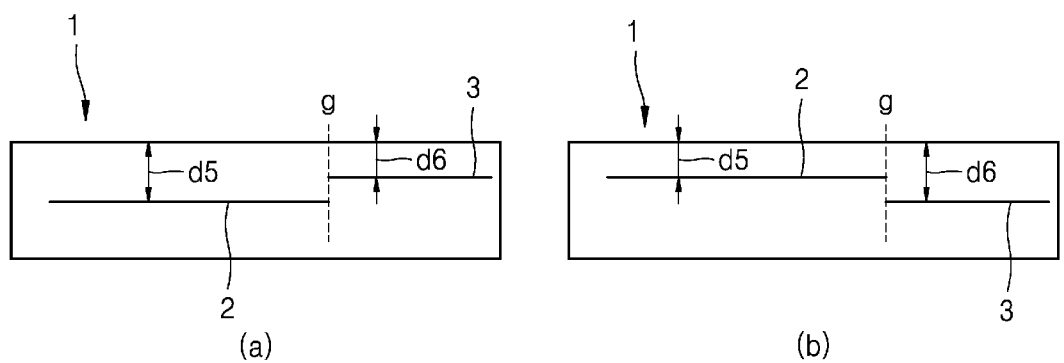
FIG. 8 is a view showing a substrate processing apparatus according to embodiments of the inventive concept.

FIG. 8 is a view of other embodiments of a substrate processing apparatus according to the disclosure. Referring to FIG. 8, the distance d5 between the first RF ground electrode 2 and the heating block surface is different from the distance d6 between the second RF ground electrode 3 and the heating block surface (d5≠d6).

According to the embodiment of FIG. 8, unlike shown in FIG. 4, plasma intensities may be separately controlled at the center and the periphery of a substrate by using a difference in distances between the respective RF ground electrodes and an upper surface of a heating block even when a single LC resonance circuit is applied. Also, unlike shown in FIG. 4, since the two RF ground electrodes are not on the same plane, there is no need to set a distance in consideration of thermal expansion (g=0).

Figure 9:
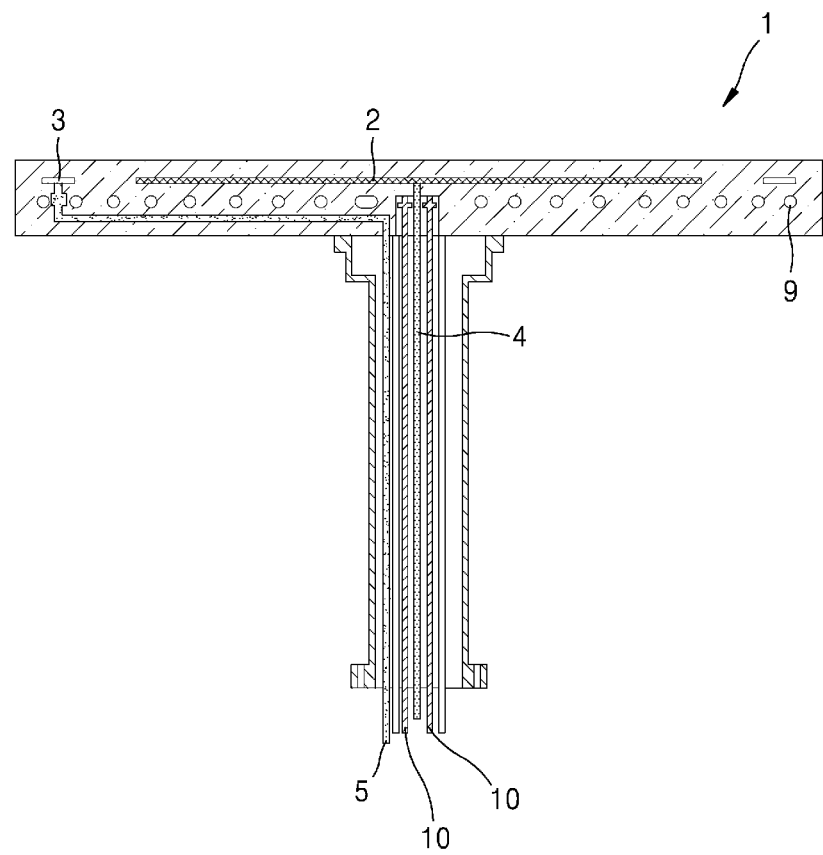
FIG. 9 is a cross-sectional view of a heating block according to embodiments of the inventive concept.

FIG. 9 is a cross-sectional view of a heating block according to the disclosure as viewed from different directions.

Referring to FIG. 9, the RF ground electrodes 2 and 3 are located between a heating element 9 and an upper surface of the heating block 1. The first RF ground electrode 2 and the second RF ground electrode 3 are respectively connected to the first RF ground rod 4 and the second RF ground rod 5, and a power rod 10 of the heating block 1 supplies power to the heating element 9.

Figure 10:
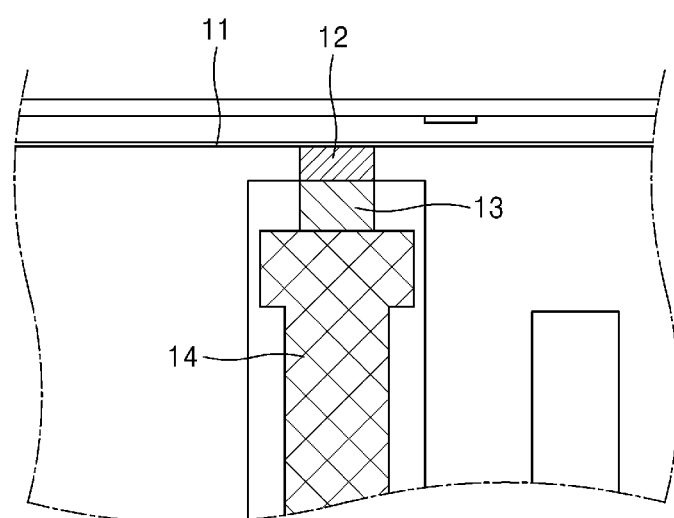
FIG. 10 is a view of a connection structure between an RF ground electrode and an RF electrode rod according to embodiments of the inventive concept.

FIG. 10 is a view of a connection structure between an RF ground electrode and an RF electrode rod.

Referring to FIG. 10, an RF ground electrode 11 is in the form of a mesh. In FIG. 10, the RF ground electrode 11 and an RF ground electrode rod 12 include an identical material, such as Mo, and an RF ground rod 14 includes a conductive material, such as Ni. A buffer electrode rod 13 connects the RF ground electrode rod 12 to the RF ground rod 14 and includes constituent materials of the RF ground electrode rod 12 and the RF ground rod 14. For example, when the RF ground electrode rod 12 includes Mo and the RF ground rod 14 includes Ni, the buffer electrode rod 13 includes a Mo—Ni alloy. As a result, an embodiment of FIG. 10 has a technical feature that may prevent the RF ground electrode rod 12 and the RF ground rod 14 including metal materials having different thermal expansion coefficients from being deviated from or separated from each other at high temperature.

Figure 11:
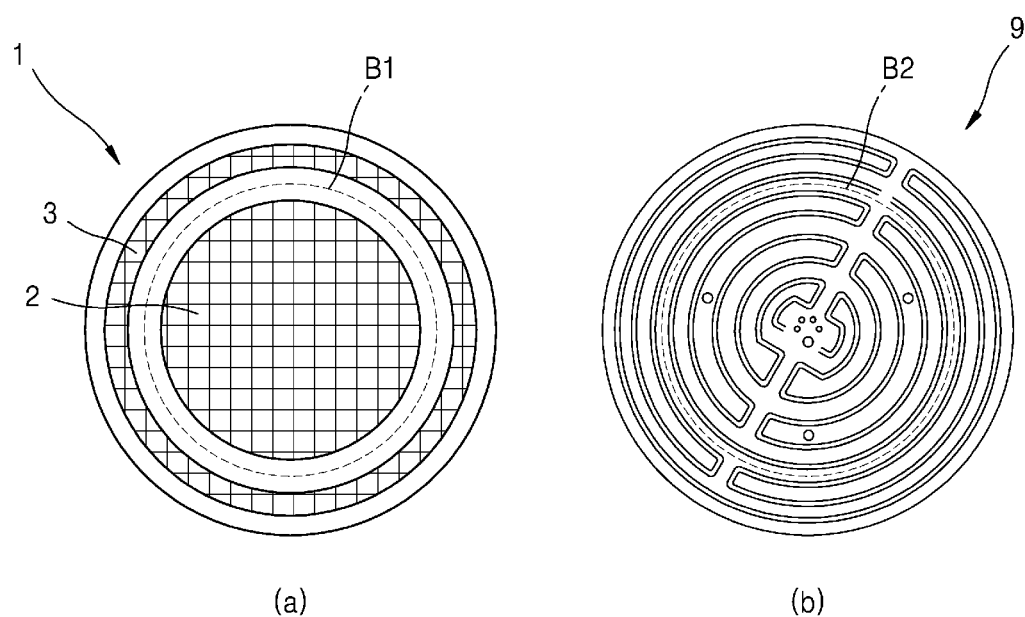
FIG. 11 is a view of an arrangement of an RF ground electrode and a heating element such as a heating wire according to embodiments of the inventive concept.

FIG. 11 shows the upper surface of the heating block 1 of FIG. 9 and shows an arrangement of the RF ground electrodes 2 and 3 and the heating element 9. As described above, each of the RF ground electrodes 2 and 3 is in the form of a mesh, and the heating element 9 is arranged to constitute a two-zone heating block, which is independently provided in the center and the periphery of the heating block 1, and forms a concentric shape based on the center of the heating block 1. A second boundary line B2 dividing the two-zone heating block corresponds to a first boundary line B1 dividing the first RF ground electrode 2 and the second RF ground electrode 3. The first boundary line B1 and the second boundary line B2 may be symmetrical to each other. For example, when the first boundary line B1 and the second boundary line B2 are circles, they may have the same diameter.

Figure 12:
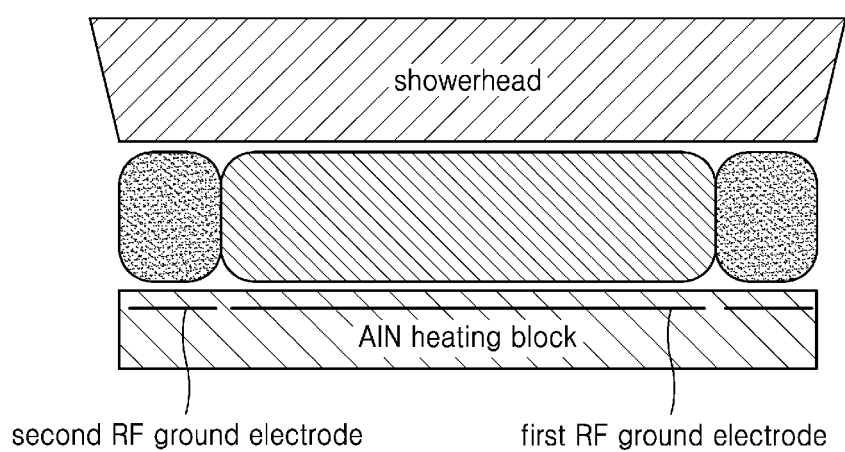
FIG. 12 is a view of plasma intensity distribution in a reactor equipped with a heating block according to embodiments of the inventive concept.

FIG. 12 shows plasma intensity distribution in a reactor equipped with a heating block according to the disclosure. FIG. 12 shows that a plasma intensity is individually controlled by RF ground electrodes arranged at the center and the periphery, and the plasma intensity may be the same or different depending on the purpose of substrate processing.

As such, according to embodiments of the inventive concept, by respectively arranging mesh type RF ground electrodes in the center and periphery of a heating block and connecting an LC resonance circuit to each of the RF ground electrodes, a plasma intensity on a substrate may be locally controlled during plasma processing, and thin film properties or thickness uniformity may be improved.

It is to be understood that the shape of each portion of the accompanying drawings is illustrative for a clear understanding of the disclosure. It should be noted that the portions may be modified into various shapes other than the shapes shown.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing apparatus comprising:
    a power supply unit;
    a processing unit electrically connected to the power supply unit; and
    a substrate support unit below the processing unit;
    wherein the substrate support unit comprises a first ground electrode, a second ground electrode, and a third ground electrode, and
    wherein the third ground electrode comprises a center electrode arranged in the center of the substrate supporting unit, wherein the first ground electrode comprises a first ring electrode surrounding the center electrode, and wherein the second ground electrode comprises a second ring electrode surrounding the first ring electrode.

2. The substrate processing apparatus of claim 1, wherein the second ground electrode is apart from the first ground electrode and arranged to surround the first ground electrode.

3. The substrate processing apparatus of claim 1, wherein the first ground electrode and the second ground electrode are electrically connected to ground, and the substrate processing apparatus comprises at least one of:
    a first plasma intensity controller connected between the first ground electrode and the ground; and
    a second plasma intensity controller connected between the second ground electrode and the ground.

4. The substrate processing apparatus of claim 3, wherein at least one of the first plasma intensity controller and the second plasma intensity controller comprises an L-C circuit comprising an inductor, a capacitor, and a variable capacitor.

5. The substrate processing apparatus of claim 4, wherein at least one of the first plasma intensity controller and the second plasma intensity controller comprises a band pass filter.

6. The substrate processing apparatus of claim 1, wherein at least one of the first ground electrode and the second ground electrode comprises a plate ground electrode.

7. The substrate processing apparatus of claim 1, wherein at least one of the first ground electrode and the second ground electrode comprises a mesh ground electrode.

8. The substrate processing apparatus of claim 7, wherein the mesh ground electrode comprises:
   a first ground line extending in a first direction; and
   a second ground line extending in a second direction different from the first direction,
   wherein the first ground line and the second ground line are electrically connected to each other.

9. The substrate processing apparatus of claim 8, wherein the first ground line and the second ground line contact each other at a portion where the first ground line and the second ground line intersect each other, and
   the first ground line and the second ground line are electrically connected to each other at a contact therebetween.

10. The substrate processing apparatus of claim 8, wherein the first ground line and the second ground line are apart from each other at a portion where the first ground line and the second ground line intersect each other, and
    the first ground line and the second ground line are electrically connected to each other by a conductive member that connects an end of the first ground line to an end of the second ground line.

11. The substrate processing apparatus of claim 8, wherein, in a plurality of first portions where the first ground line and the second ground line intersect each other, a distance between an upper surface of the substrate support unit and the first ground line is greater than a distance between the upper surface of the substrate support unit and the second ground line, and
    in a second portion other than the first portion, a distance between the upper surface of the substrate support unit and the first ground line is equal to a distance between the upper surface of the substrate support unit and the second ground line.

12. The substrate processing apparatus of claim 7, wherein the first ground electrode comprises a first mesh ground electrode, and
    the second ground electrode comprises a second mesh ground electrode,
    wherein the first mesh ground electrode and the second mesh ground electrode have different mesh densities.

13. The substrate processing apparatus of claim 1, wherein the substrate support unit further comprises:
    a first heating unit below the first ground electrode; and
    a second heating unit below the second ground electrode,
    wherein the first heating unit and the second heating unit are independently controlled.

14. The substrate processing apparatus of claim 2, wherein the first ground electrode and the second ground electrode are separated in the lateral direction by 5 mm or more.

15. The substrate processing apparatus of claim 1, wherein at least one of the first ground electrode and the second ground electrode comprise a first wire and a second wire, wherein the first wire and the second wire are configured such that the first and second wire intersect an X direction and Y direction, such that the distance from the surface of the substrate supporting to the first wire is the same as the distance from the substrate supporting unit to the second wire.

16. The substrate processing apparatus of claim 1, wherein the first ground electrode and the second ground electrode are not separated in the lateral direction, but are separated in the vertical direction.

17. The substrate processing apparatus of claim 1, wherein the first ground electrode and the second ground electrode comprise molybdenum (Mo).

18. A substrate processing apparatus comprising:
    a power supply unit;
    a processing unit electrically connected to the power supply unit; and
    a substrate support unit below the processing unit;
    wherein the substrate support unit comprises a first ground electrode, and a second ground electrode,
    wherein the first ground electrode comprises a first mesh ground electrode, and
    the second ground electrode comprises a second mesh ground electrode,
    wherein the first mesh ground electrode and the second mesh ground electrode have different mesh densities.

19. The substrate process apparatus of claim 18, wherein a plasma density or a plasma intensity on a substrate is locally controlled.

20. A substrate processing apparatus comprising:
    a power supply unit;
    a processing unit electrically connected to the power supply unit; and
    a substrate support unit below the processing unit,
    wherein the substrate support unit comprises a first ground electrode and a second ground electrode,
    wherein the substrate support unit further comprises:
      a first heating unit below the first ground electrode; and
      a second heating unit below the second ground electrode,
    wherein the first heating unit and the second heating unit are independently controlled.

* * * * *